US010938357B2

(12) United States Patent
Jones

(10) Patent No.: US 10,938,357 B2
(45) Date of Patent: Mar. 2, 2021

(54) AUDIO AMPLIFIER WITH INTEGRATED FILTER

(71) Applicant: THX LTD., San Fransisco, CA (US)

(72) Inventor: Owen Jones, Ipswich (GB)

(73) Assignee: THX LTD., San Fransisco, CA (US)

( * ) Notice: Subject to any disclaimer, the term of this patent is extended or adjusted under 35 U.S.C. 154(b) by 0 days.

(21) Appl. No.: 16/584,327

(22) Filed: Sep. 26, 2019

(65) Prior Publication Data
US 2020/0106401 A1    Apr. 2, 2020

Related U.S. Application Data

(60) Provisional application No. 62/737,674, filed on Sep. 27, 2018.

(51) Int. Cl.
| | |
|---|---|
| *H03F 3/68* | (2006.01) |
| *H03F 3/183* | (2006.01) |
| *H03F 3/45* | (2006.01) |
| *H03H 7/01* | (2006.01) |
| *H03M 1/66* | (2006.01) |
| *H03G 3/30* | (2006.01) |

(52) U.S. Cl.
CPC ......... *H03F 3/183* (2013.01); *H03F 3/45071* (2013.01); *H03G 3/30* (2013.01); *H03H 7/0138* (2013.01); *H03M 1/66* (2013.01)

(58) Field of Classification Search
CPC ...................................................... H03F 3/68
USPC .................................. 330/98, 260, 310, 150
See application file for complete search history.

(56) References Cited

U.S. PATENT DOCUMENTS

| | | | |
|---|---|---|---|
| 4,523,152 A | | 6/1985 | Garde |
| 8,004,355 B2 * | | 8/2011 | Jones .................... H03F 1/0205 |
| | | | 330/98 |
| 10,404,221 B2 | | 9/2019 | Jones et al. |
| 2012/0218043 A1 | | 8/2012 | Teng |
| 2014/0111281 A1 | | 4/2014 | Jones et al. |
| 2014/0348335 A1 | | 11/2014 | Scott et al. |
| 2017/0347195 A1 | | 11/2017 | De Vries |

OTHER PUBLICATIONS

AsahiKasei, "AK4452", 115dB 768kHz 32-bit 2ch Premium DAC, Jul. 2017, pp. 1, 83.
Bruce Carter and L.P. Huelsman, "Handbook of Operational Amplifier Active RC Networks", Texas Instruments, Application Report, SBOA093A, Oct. 2001, 85 pages.

(Continued)

*Primary Examiner* — Henry Choe
(74) *Attorney, Agent, or Firm* — Schwabe, Williamson & Wyatt, P.C.

(57) ABSTRACT

Embodiments provide an audio amplifier circuit with integrated (built-in) filter (e.g., a digital-to-analog converter (DAC) filter). The audio amplifier circuit may have a non-flat (e.g., low-pass) closed loop frequency response. The audio amplifier circuit may include a low pass filter coupled between an input terminal that receives the input analog audio signal and the input of the gain stage of the amplifier. In some embodiments, additional impedance networks may be included to produce a desired low-pass filter response, such as a second order filter, a third order filter, and/or another suitable filter response. Other embodiments may be described and/or claimed.

24 Claims, 6 Drawing Sheets

(56) References Cited

OTHER PUBLICATIONS

Ryan (Fan) Wang, "DAC Post-Filter Design Based on DRV6xx Family, HPA-AIP-Home Audio Amplifiers", Texas Instruments, Application Report, SLOA150A, Sep. 2010, 85 pages.
International Search Report and Written Opinion dated Dec. 17, 2019 for International Application No. PCT/US2019/053255, 14 pages.

* cited by examiner

000# AUDIO AMPLIFIER WITH INTEGRATED FILTER

CROSS-REFERENCE TO RELATED APPLICATION

The present application claims priority to U.S. Provisional Patent Application No. 62/737,674, filed Sep. 27, 2018, the entire disclosure of which is hereby incorporated by reference.

TECHNICAL FIELD

Embodiments herein relate to the field of electronic circuits, and, more specifically, to an audio amplifier with integrated filter.

BACKGROUND

Some audio reproduction devices include a digital-to-analog converter (DAC) circuit to convert a digital audio signal to an analog audio signal. A DAC filter may be included at the output of the DAC circuit to roll-off the response of the circuit above the audio band and thereby attenuate the level of high frequency switching components present at the DAC output. A separate amplifier circuit may be included after the DAC filter to amplify the analog audio signal and drive one or more audio output devices (e.g., headphones and/or speakers).

BRIEF DESCRIPTION OF THE DRAWINGS

Embodiments will be readily understood by the following detailed description in conjunction with the accompanying drawings and the appended claims. Embodiments are illustrated by way of example and not by way of limitation in the figures of the accompanying drawings.

DETAILED DESCRIPTION OF DISCLOSED EMBODIMENTS

Figure 1:
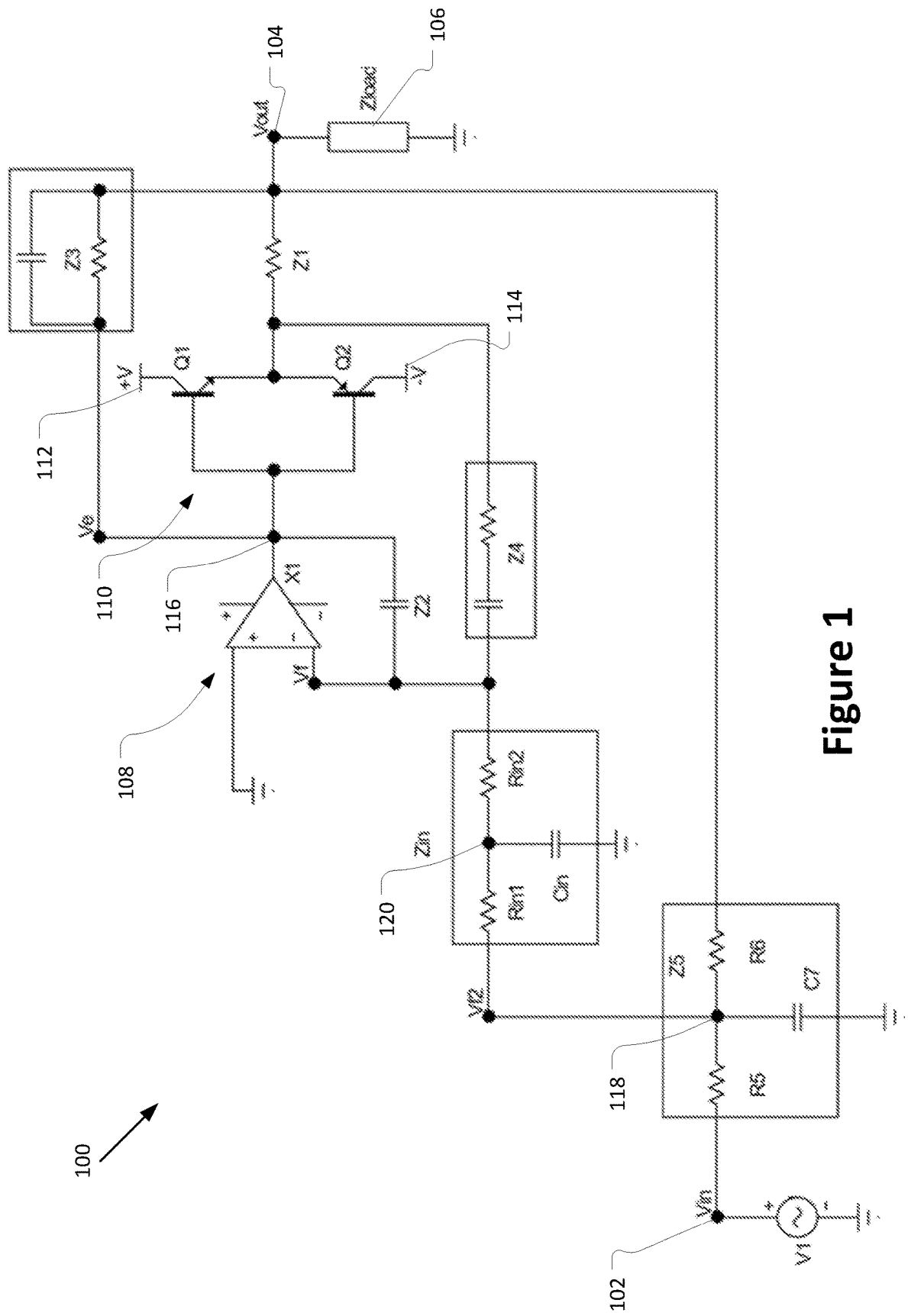
FIG. 1 schematically illustrates an audio amplifier circuit with built-in filter, in accordance with various embodiments.

In the following detailed description, reference is made to the accompanying drawings which form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense.

Various operations may be described as multiple discrete operations in turn, in a manner that may be helpful in understanding embodiments; however, the order of description should not be construed to imply that these operations are order-dependent.

The description may use perspective-based descriptions such as up/down, back/front, and top/bottom. Such descriptions are merely used to facilitate the discussion and are not intended to restrict the application of disclosed embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact.

However, "coupled" may also mean that two or more elements are not in direct contact with each other, but yet still cooperate or interact with each other.

For the purposes of the description, a phrase in the form "A/B" or in the form "A and/or B" means (A), (B), or (A and B). For the purposes of the description, a phrase in the form "at least one of A, B, and C" means (A), (B), (C), (A and B), (A and C), (B and C), or (A, B and C). For the purposes of the description, a phrase in the form "(A)B" means (B) or (AB) that is, A is an optional element.

The description may use the terms "embodiment" or "embodiments," which may each refer to one or more of the same or different embodiments. Furthermore, the terms "comprising," "including," "having," and the like, as used with respect to embodiments, are synonymous, and are generally intended as "open" terms (e.g., the term "including" should be interpreted as "including but not limited to," the term "having" should be interpreted as "having at least," the term "includes" should be interpreted as "includes but is not limited to," etc.).

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

With respect to the use of any plural and/or singular terms herein, those having skill in the art can translate from the plural to the singular and/or from the singular to the plural as is appropriate to the context and/or application. The various singular/plural permutations may be expressly set forth herein for sake of clarity.

Embodiments herein provide an audio amplifier circuit with integrated (built-in) filter (e.g., a digital-to-analog converter (DAC) filter). The audio amplifier circuit may have a non-flat (e.g., low-pass) closed loop frequency response. The audio amplifier circuit described herein may have reduced circuit complexity/cost, power consumption, and/or distortion compared with circuits that include separate filter and audio amplifier circuits. While the audio amplifier circuit is described herein with reference to a DAC filter, the audio amplifier circuit may be used in any suitable implementation in which the provided filter response is desired.

In some embodiments, the audio amplifier circuit may include a low pass filter coupled between an input terminal that receives the input analog audio signal and the input of the gain stage of the amplifier (e.g., the inverting input of an operational amplifier (op-amp) of the gain stage). In some embodiments, additional impedance networks may be included to produce a desired low-pass filter response, such as a second order filter, a third order filter, and/or another suitable filter response.

The audio amplifier circuit with integrated filter may be implemented in a single-ended or differential amplifier arrangement.

The audio amplifier circuit may include a plurality of amplifier stages, including a first amplifier stage (e.g., a gain/driver stage) and a second amplifier stage (e.g., an output stage). In some embodiments, the audio amplifier circuit may include additional amplifier stages, such as one or more intermediate amplifier stages coupled between the first amplifier stage and the second amplifier stage. The audio amplifier circuit may further include impedance networks to provide feedback and/or feedforward paths for the amplifier stages. For example, the impedance networks may include an impedance network to provide a feedback path from the output of the first amplifier stage to an input of the first amplifier stage, an impedance network to provide a feedback path from the output of the second amplifier stage to an input of the first amplifier stage, an impedance network coupled between the output of the second amplifier stage and the output terminal of the amplifier circuit (e.g., that is coupled to the load), and/or an impedance network coupled between the output of the first amplifier stage and the output terminal of the amplifier circuit. An additional impedance network may provide a feedback path from the output terminal of the circuit (coupled to the load) to the input of the first amplifier stage. The impedance networks may include one or more resistors and/or capacitors. In some embodiments, the impedance networks may be exclusively composed of resistors and/or capacitors.

The amplifier circuit described herein may have low power dissipation and low distortion compared with prior designs. The amplifier stages may be operated in any suitable operating mode, as appropriate, such as Class A, Class AB, Class B, Class G, Class H, etc. In some embodiments, different amplifier stages may be operated in the same or different operating modes.

FIG. 1 illustrates an audio amplifier circuit 100 (hereinafter "circuit 100") with built-in DAC filter, in accordance with various embodiments. The circuit 100 receives an analog input audio signal Vin at an input terminal 102 and generates an output audio signal Vout at an output terminal 104. The output audio signal Vout may drive a load 106 coupled to the output terminal 104. The load 106 may be one or more audio output devices, such as headphones and/or speakers.

The circuit 100 may include a gain stage 108 (also referred to as driver stage 108) and an output stage 110. The gain stage 108 and output stage 110 may be coupled in series between the input terminal 102 and output terminal 104 to process/amplify the audio signal. As such, the gain stage 108 and output stage 110 may both be referred to as amplifier stages. However, in some embodiments, the output stage 110 may be configured to provide unity gain. In other embodiments, the output stage 110 may provide another suitable gain.

The gain stage 108 may include one or more amplifiers to amplify the analog input audio signal. For example, gain stage 108 is shown in FIG. 1 to include an amplifier X1 with an input terminal coupled to receive the input audio signal (e.g., via impedance networks Zin and Z5, which will be discussed further below). The output stage 110 may be coupled between the output of the gain stage 108 and the output terminal 104 of the circuit 100. For example, the output stage 110 may include a pair of transistors Q1 and Q2. The collector of Q1 may be coupled to a positive supply rail 112 to receive a positive supply voltage +V, and the collector of Q2 may be coupled to a negative supply rail 114 to receive a negative supply voltage −V. The bases of the transistors Q1 and Q2 may be coupled together at the input of the output stage 110 to receive the output signal from the gain stage 108. The emitters of the transistors Q1 and Q2 may be coupled together at the output of the output stage 110 to pass the output audio signal to the output terminal 104 (e.g., via impedance network Z1). The transistors Q1 and Q2 may be biased by a bias circuit (not shown) to operate in a desired operating mode. While the transistors Q1 and Q2 are shown as bipolar junction transistors, it will be apparent that other embodiments may include another type of transistor, such as field-effect transistors (FETs) (e.g., metal-oxide-semiconductor FETs (MOSFETs)).

Additionally, it will be apparent that the circuit 100 may include different designs of the gain stage 108 and/or output stage 110, more or fewer amplifier stages, and/or other modifications as known to those skilled in the art. For example, in some embodiments, the output stage 110 may include a compound amplifier (e.g., op-amp) in addition to or instead of the complementary emitter-follower arrangement of transistors Q1 and Q2 depicted in FIG. 1.

The circuit 100 may further include a plurality of impedance networks, such as impedance networks Z1, Z2, Z3, Z4, and/or Z5. Impedance network Z1 may be coupled between the output of the output stage 110 and the output terminal 104 of the circuit 100. The impedance network Z2 may be coupled between the input terminal of the gain stage 108 (at which the gain stage 108 receives the audio input signal, such as the inverting input of op-amp X1 as shown in FIG. 1) and a node 116 at which the output of the gain stage 108 is coupled with the input of the output stage 110. Impedance network Z3 may be coupled between the node 116 and the output terminal 104 (e.g., in parallel with the combination of output stage 110 and impedance network Z1). Impedance network Z4 may be coupled between the input of the gain stage 108 and the output of the output stage 110.

The impedance networks Z1, Z2, Z3, and Z4 may be balanced (e.g., in what is referred to as a bridge arrangement) to provide low distortion. For example, the impedance networks Z1, Z2, Z3, and Z4 may be designed to satisfy the relationship $Z1(s) \cdot Z2(s) = Z3(s) \cdot Z4(s)$, where $Z(s)$ refers to the impedance as a function of frequency. Additionally, imperfect characteristics of gain stage 108 may be compensated for by suitably altering impedance network Z2 (for instance by compensating for a dominant pole in gain stage 108 by reducing the value of Z2 when Z2 is a capacitor).

The impedance networks may include one or more impedance elements, such as one or more resistors and/or capacitors, to provide the desired impedance and/or frequency response. For example, impedance network Z1 may include a resistor 114 coupled between the output of the output stage 110 and the output terminal 104 of the circuit 100. The impedance network Z2 may include a capacitor coupled between the input terminal of the gain stage 108 the node 116 at which the output of the gain stage 108 is coupled with the input of the output stage 110. Impedance network Z3 may include a resistor in parallel with a capacitor. Impedance network Z4 may include a resistor in series with a capacitor.

In various embodiments, impedance network Z5 may be coupled between the input terminal 102 and the output terminal 104. The impedance network Z5 is shown to include a resistor R5 and resistor R6 coupled in series between the input terminal 102 and output terminal 104. The impedance network Z5 may further include a capacitor C7 coupled between a node 118 (that is between the resistors R5 and R6) and ground.

In various embodiments, the circuit 100 may further include an input impedance network Zin coupled between the input terminal 102 and the input of the gain stage 108. For example, in some embodiments, the impedance network Zin may be coupled between the node 118 of the impedance network Z5 and the input of the gain stage 108. The input impedance network Zin may form a low pass filter. For example, the input impedance network Zin may filter the signal present at node 118, which is based on the input audio signal and the feedback received from the output node 104 via the impedance network Z5.

Without the input impedance network Zin and/or impedance network Z5, the closed loop response of the circuit including the impedance networks Z1-Z4, the gain stage 108, and the output circuit 110 would be such that, below a certain frequency (e.g., determined by the time constant of impedance network Z4), the gain of the circuit increases at 6 dB per octave as frequency decreases. Accordingly, the circuit would have a zero in its response at the frequency determined by the time constant of impedance network Z4. Therefore, the circuit would be a partial integrator. The low pass filter provided by the impedance network Zin counterbalances the zero in impedance network Z4, thereby causing the closed loop response of the circuit 100 to be that of a full integrator. In other embodiments, the impedance network Z5 may counterbalance impedance network Z4 instead of, or in cooperation with, impedance network Zin. The input impedance network Zin and/or impedance network Z5 will not significantly disturb the bridge balance of impedance networks Z1-Z4 since they are coupled outside of the bridge circuit formed by impedance networks Z1-Z4. In some embodiments, the impedance network Z2, which provides feedback for the gain stage 108, may be modified from the design shown in FIG. 1 if the open loop gain of the gain stage 108 (e.g., operational amplifier X1) is not sufficiently high to otherwise avoid disturbing the bridge balance. For example, as described above, the value of the capacitor of Z2 may be reduced.

In various embodiments, impedance network Zin may form an integrator with gain stage 108 (e.g., amplifier X1) and impedance networks Z2 and Z4. The integrator may provide the circuit 100 with an overall frequency response that is a low-pass filter. Accordingly, the circuit 100 may be used as a DAC filter and/or in another implementation in which the provided filter response is desired.

The input impedance network Zin may include any suitable components to provide the low pass filter. For example, as shown in FIG. 1, the impedance network Zin may include resistors Rin1 and Rin2 coupled in series between the input terminal 102 of the circuit 100 and the input of the gain stage 108. A capacitor Cin may be coupled between a node 120 (that is between the resistors Rin1 and Rin2) and ground.

The feedback loop formed by impedance network Z5 may not disturb the balance of the bridge circuit formed by impedance networks Z1-Z4, since the feedback path is outside the bridge arrangement formed by impedance networks Z1-Z4 (e.g., because impedance network Z5 derives feedback from the output voltage signal at output terminal 104). Additionally, because the closed loop response of the internal amplifier arrangement is that of an integrator, as described above, the feedback loop formed by the impedance network Z5 may reduce the closed loop output impedance of the overall circuit 100.

In various embodiments, the circuit 100 may implement a nominal 2nd order low pass filter, for example, similar to an infinite gain multiple feedback filter (referred to as an MFB filter). However, in contrast to an MFB filter, the input impedance network Zin may provide a loading on the node 118 of impedance network Z5 that corresponds to the parallel combination of resistor Rin2 and capacitor Cin in series with resistor Rin1. This loading may alter the response of the filter away from a true 2nd order filter. In some embodiments, values of the components of impedance network Z5 (e.g., R5, R6, and C7), input impedance network Zin (e.g., Rin1, Rin2, and/or Cin), and/or other components of circuit 100 may be selected to approximate a 2nd order filter over a wide frequency range. Alternatively, or additionally, the impedance network Z5 may be modified from the design shown in FIG. 1 to implement a true 2nd order filter or a closer approximation of a true 2nd order filter. For example, a suitable resistance-capacitance network may be added across both resistor R5 and resistor R6.

Figure 2:
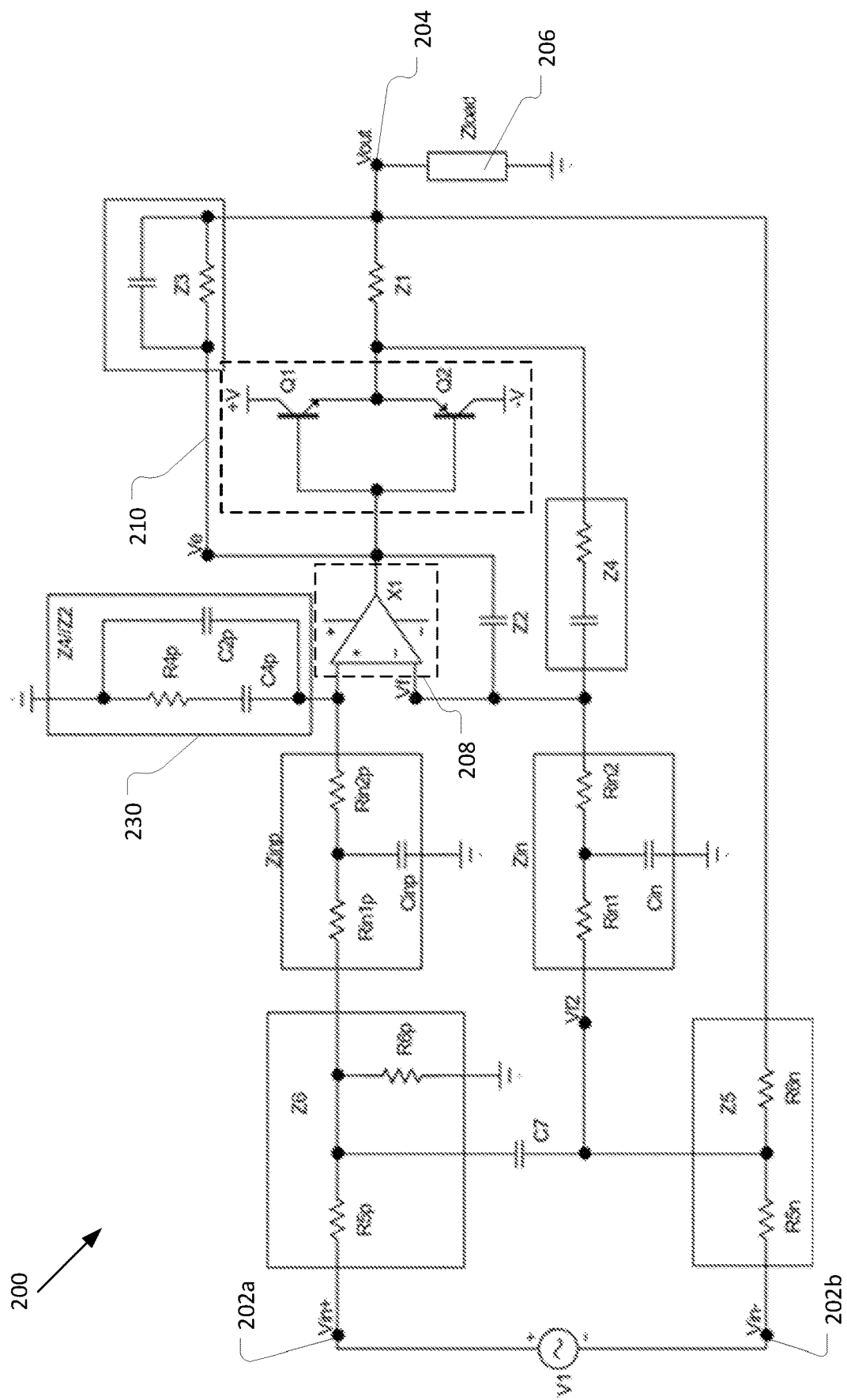
FIG. 2 schematically illustrates a differential audio amplifier circuit with built-in filter, in accordance with various embodiments.

FIG. 2 illustrates another audio amplifier circuit 200 (hereinafter "circuit 200") with built-in DAC filter, in accordance with various embodiments. The circuit 200 uses a differential input, in contrast to the single-ended input of circuit 100. The circuit 200 receives a differential input audio signal (e.g., Vin+ and Vin−) at input terminals 202a and 202b, and generates an output audio signal Vout at an output terminal 204. The output audio signal Vout may drive a load 206 coupled to the output terminal 204. The load 206 may be one or more audio output devices, such as headphones and/or speakers.

The circuit 200 may include a gain stage 208 (also referred to as driver stage 208), an output stage 210, and impedance networks Z1, Z2, Z3, and/or Z4. The gain stage 208, output stage 210, and/or impedance networks Z1, Z2, Z3, and/or Z4 may be similar to the respective gain stage 108, output stage 110, and/or impedance networks Z1, Z2, Z3, and/or Z4 of circuit 100.

As discussed above with respect to circuit 100, the impedance networks Z2 and Z4 may provide feedback for the gain stage 208 at a first input terminal of the gain stage 208 (e.g., at the inverting input of op-amp X1). The circuit 200 may further include an impedance network 230 coupled between the second input terminal of the gain stage 208 and ground. The impedance network 230 may approximately match the operation of impedance networks Z4, Z2, gain stage 208, and output stage 210. For example, the impedance network 230 may provide an impedance that corresponds to the impedance of Z2 in parallel with Z4, as shown (e.g., with capacitor C2p in parallel with the series combination of capacitor C4p and resistor R4p).

The values of capacitor C4p and resistor R4p may be determined based on the gain provided by output stage 210 (e.g., unity gain or non-unity gain). For example, if the gain of the output stage 210 is less than one, then the impedance of various elements of impedance network 230 should be increased compared with the impedance for unity gain in output stage 210. Additionally, or alternatively, in some embodiments, a limited gain bandwidth product of the op-amp X1 may be taken into account by increasing the capacitance of capacitor C2p.

In various embodiments, a first input terminal of the gain stage 108 (e.g., the inverting input terminal of op-amp X1) may be coupled to the input terminal 202a to receive one component (Vin−) of the differential input signal. For example, the first input terminal of the gain stage 108 may be coupled to the input terminal 202a via an input impedance network Zin and an impedance network Z5. Input impedance network Zin and impedance network Z5 may be similar to the corresponding impedance networks of circuit 100.

A second input terminal of the gain stage 108 (e.g., the non-inverting input terminal of op-amp X1) may be coupled to the input terminal 202b to receive the other component (Vin+) of the differential input signal. For example, the second input terminal of the gain stage 108 may be coupled to the input terminal 202b via a second input impedance network Zinp and an input impedance network Z6. The second input impedance network Zinp may Impedance networks Z5 and Z6 may both provide a low-pass filter. In some embodiments, a capacitor C7 may be shared between the impedance networks Z5 and Z6, as shown. The capacitor C7 may thus be considered to be part of both impedance networks Z5 and Z6. In other embodiments, impedance networks Z5 and Z6 may include separate capacitors coupled between the respective internal nodes and ground. In some embodiments, the impedance network Z6 may include a resistor R5p coupled in series between the input terminal 202b and the second input terminal of the gain stage 208, and another resistor R6p coupled in shunt with the signal path. It will be apparent that other designs are possible.

The input impedance networks Zin and Zinp are shown in FIG. 2 to include separate capacitors Cin and Cinp. In some embodiments, the input impedance networks Zin and Zinp may share a capacitor instead of using separate capacitors, similar to the sharing of capacitor C7 by impedance networks Z5 and Z6.

Figure 3:
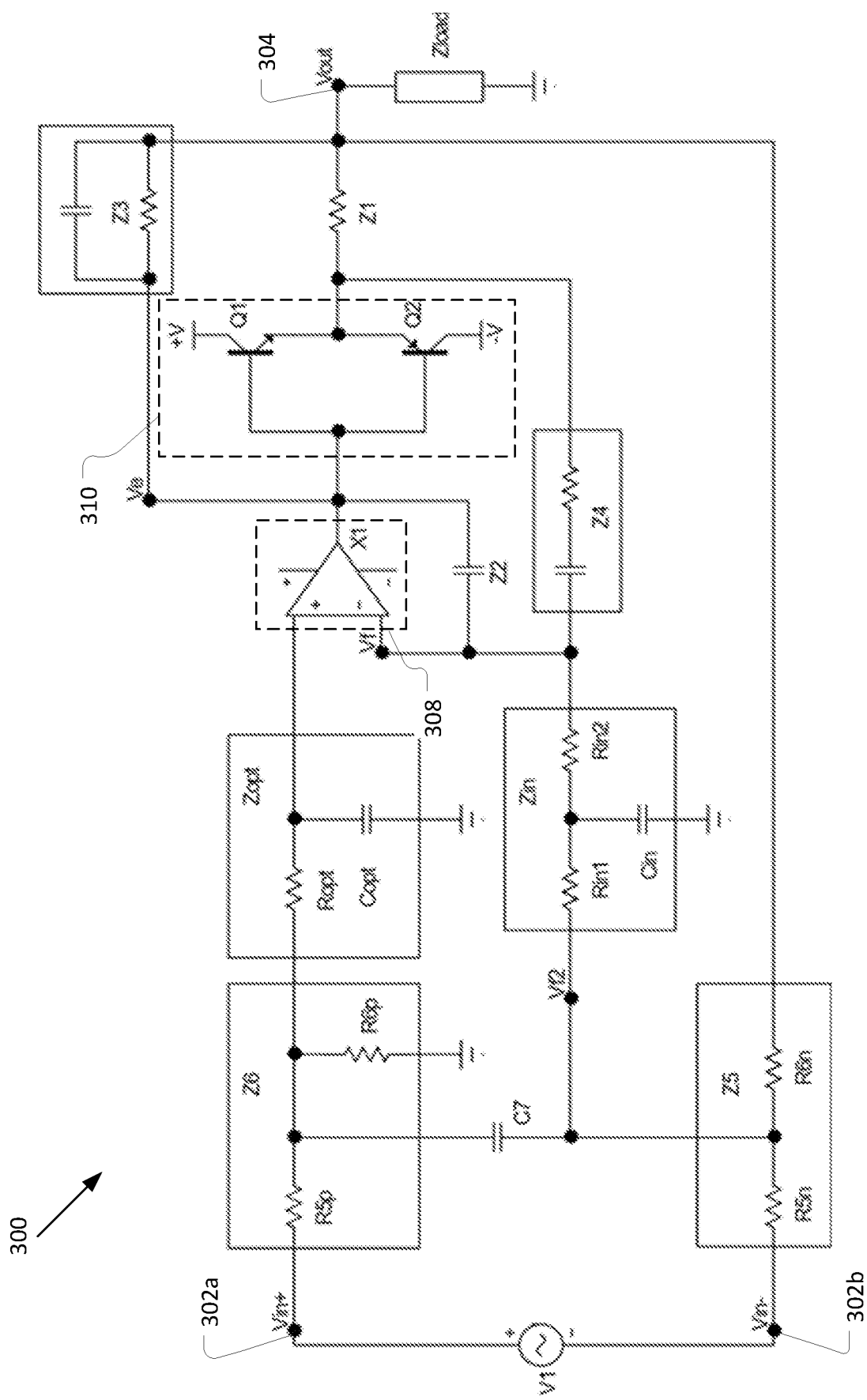
FIG. 3 schematically illustrates a partially balanced differential audio amplifier circuit with built-in filter, in accordance with various embodiments.

FIG. 3 illustrates another audio amplifier circuit 300 (hereinafter "circuit 300") with built-in DAC filter, in accordance with various embodiments. Circuit 300 may be similar to the circuit 200, except that impedance network 230 is omitted, and the second input impedance network Zinp is replaced with an input impedance network Zopt. The circuit 300 may have lower common-mode rejection performance than the circuit 200, but with a simpler circuit layout. The input impedance network Zopt may provide a low-pass filter and may be designed to provide suitable (e.g., optimized) common-mode rejection and differential frequency response. For example, the impedance network Zopt may include a resistor Ropt in series with the signal path between input terminal 302b and the second input terminal of the gain stage 308, and a capacitor Copt coupled in shunt with the signal path (between the signal path and ground). The values of the resistor Ropt and capacitor Copt may be selected to optimize the common-mode rejection and differential frequency response of the circuit 300.

In some embodiments, the input impedance network Zin and the input impedance network Zopt may share a capacitor instead of including separate capacitors Cin and Copt.

Figure 4:
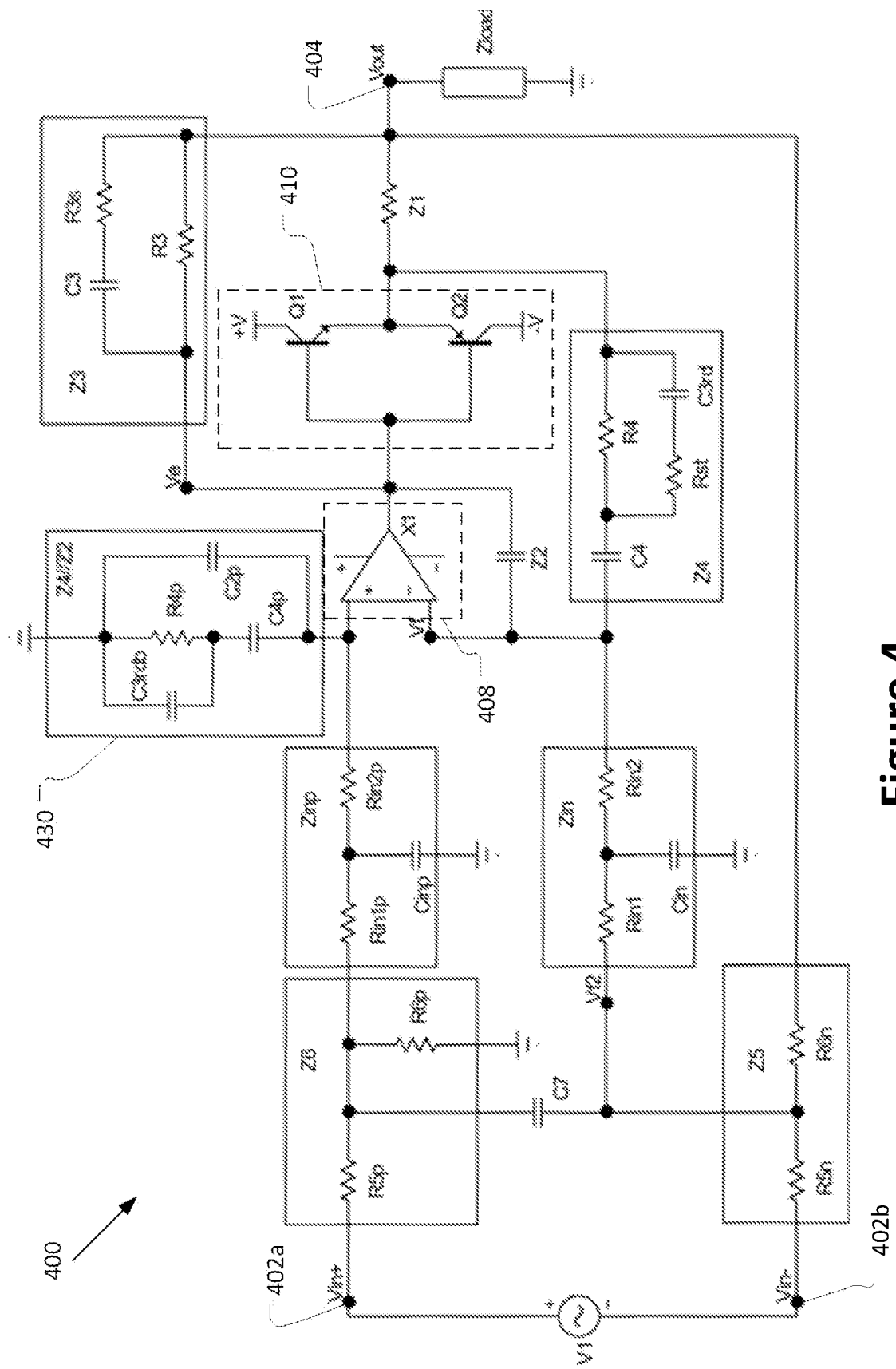
FIG. 4 schematically illustrates a differential audio amplifier circuit with built-in filter having a third order filter response, in accordance with various embodiments.

In some embodiments, the amplifier circuit with built-in DAC filter may be designed to provide a third order filter (e.g., third order roll-off of the frequency response). For example, FIG. 4 illustrates an audio amplifier circuit 400 (hereinafter "circuit 400") with built-in DAC filter that provides a third order filter response, in accordance with various embodiments. The circuit 400 may be similar to the circuit 200. However, the impedance network Z4 may be modified from circuit 200 to obtain the third order filter. For example, the impedance network Z4 may include an additional capacitor C3rd coupled in parallel with capacitor C3. In some embodiments, a resistor Rst may be coupled in series with capacitor C3rd (e.g., with resistor Rst between the capacitor C3rd and the output terminal 404), with the series combination of Rst and C3rd coupled in parallel with capacitor C3. The resistor Rst may facilitate stability of the closed loop in circuit 400, for example, depending on the gain-bandwidth of the output stage 410. In other embodiments, the resistor Rst may be omitted. In addition to, or instead of, including resistor Rst, an additional low-pass filter may be included between the output of the gain stage 408 and the input of the output stage 410 (e.g., coupled between the output of op-amp X1 and the input to transistors Q1 and Q2).

The impedance network Z3 may be modified from circuit 300 to balance the bridge arrangement with the impedance network Z4. For example, a resistor R3s may be coupled in series with capacitor C3 (e.g., with the series combination of R3s and C3 coupled in parallel with resistor R3.

The impedance network 430 may also be modified from the impedance network 230 of circuit 200, to balance the common-mode rejection and differential filter response in light of the modifications to impedance network Z4. For example, an additional capacitor C3rdb may be coupled in parallel with resistor R4p in the impedance network 430.

Figure 5:
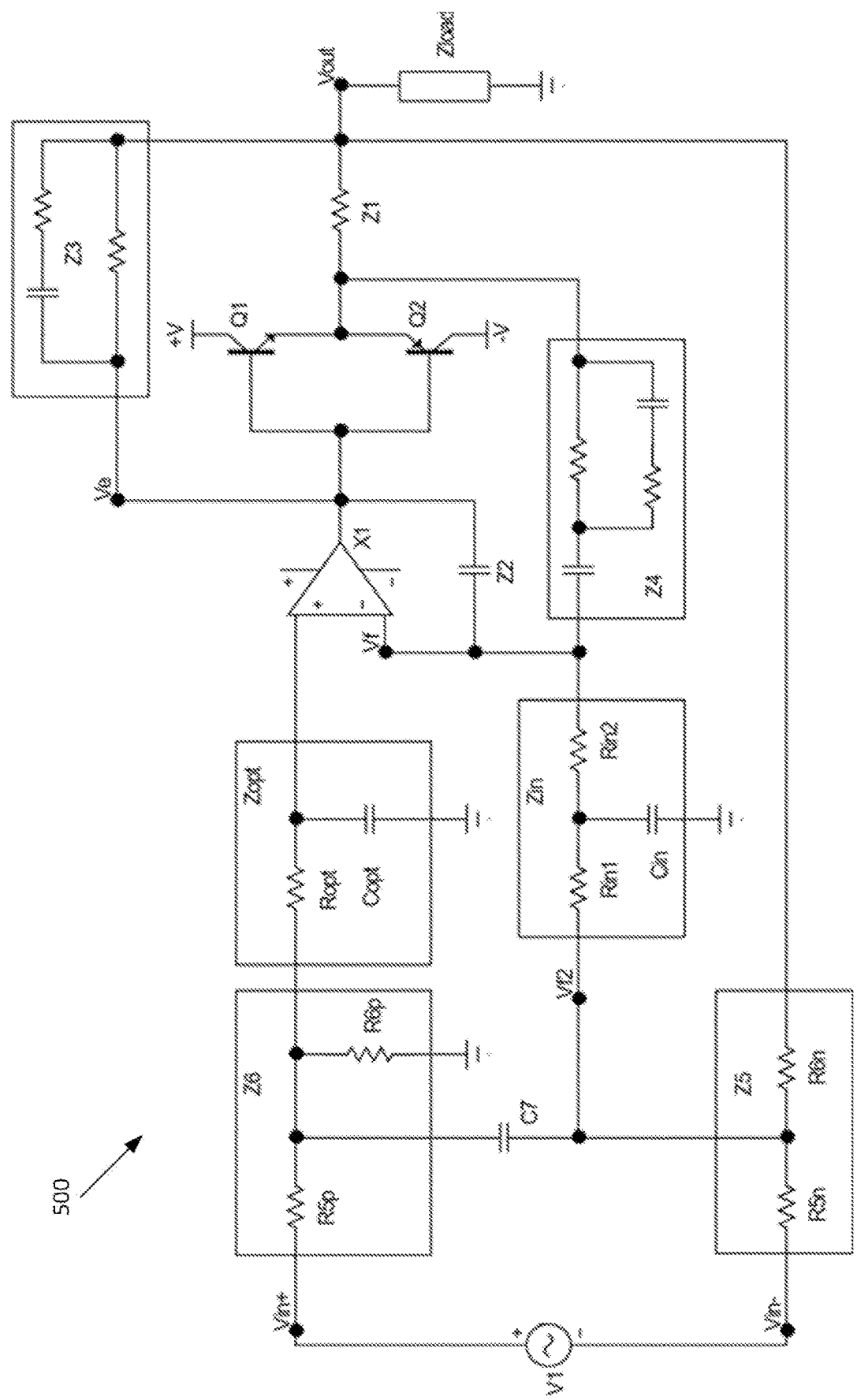
FIG. 5 schematically illustrates a partially balanced differential audio amplifier circuit with built-in filter having a third order filter response, in accordance with various embodiments.

In some embodiments, the circuit 400 may be simplified in a similar manner to the way circuit 300 is a simplified version of circuit 200. For example, FIG. 5 illustrates another audio amplifier circuit 500 (hereinafter "circuit 500") with built-in DAC filter, in accordance with various embodiments. Circuit 500 may be similar to the circuit 400, except that impedance network 430 is omitted, and the second input impedance network Zinp is replaced with an input impedance network Zopt.

Accordingly, the circuit 500 may be partially balanced, and have reduced common-mode rejection ratio compared to the fully balanced configuration of circuit 400. However, the common-mode rejection ratio of the circuit 500 may still be sufficient for some applications.

In various embodiments, the circuits 100, 200, 300, 400, and/or 500 may be modified from the specific configurations/components shown in FIGS. 1-5. For example, the output stage, which is shown in FIGS. 1-5 to include transistors Q1 and Q2, may include another suitable configuration and/or may include other components.

Additionally, or alternatively, the inverting input of the op-amp X1 may be either voltage-sensing or current-sensing. When the inverting input is current-sensing, the balance is less sensitive to gain bandwidth (GBW) as input network impedance is altered.

While the amplifier circuits described herein have focused on implementing second or third order filters, in some embodiments, the amplifier circuit may implement a higher or lower order of filter.

Figure 6:
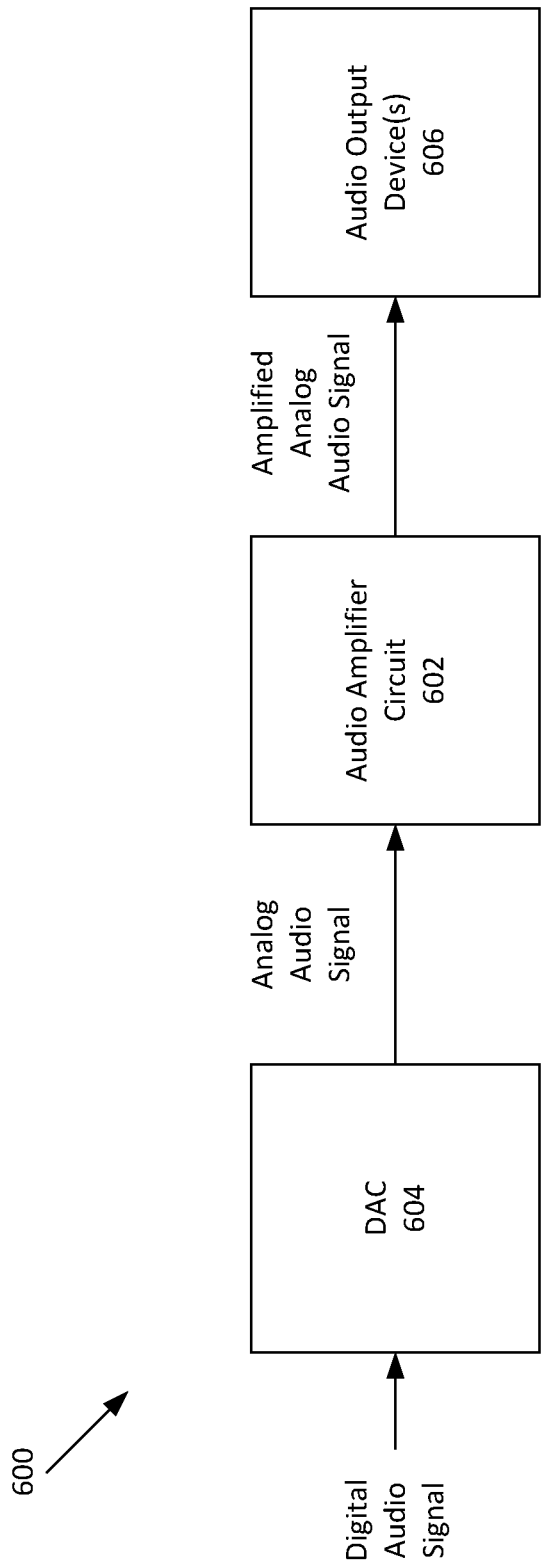
FIG. 6 schematically illustrates an audio reproduction system that may implement the audio amplifier circuit described herein, in accordance with various embodiments.

The amplifier circuit described herein (e.g., circuit 100, 200, 300, 400, and/or 500) may be included in any suitable audio reproduction system. FIG. 6 schematically illustrates one example of a system 600 that includes an audio amplifier circuit 602 that may correspond to any one of the amplifier circuits described herein (e.g., circuit 100, 200, 300, 400, and/or 500). The system 600 may include a DAC 604 to receive a digital audio signal and generate an analog audio signal based on the received digital audio signal. The digital audio signal may be received from another component of the system 600 (e.g., a processor, media player, digital signal processor, etc.) and/or another device that is communicatively coupled with the system 600 (e.g., via a wired connection (e.g., Universal Serial Bus (USB), optical digital, coaxial digital, high definition media interconnect (HDMI), wired local area network (LAN), etc.) and/or wireless connection (e.g., Bluetooth, wireless local area network (WLAN, such as WiFi), cellular, etc.).

The amplifier circuit 602 may amplify the analog audio signal received from the DAC 604 to generate an amplified audio signal. The amplifier circuit 602 may include a built-in DAC filter, as described herein. The amplifier circuit 602 may pass the amplified audio signal to one or more audio output devices 606. The audio output devices 606 may include any suitable devices to generate an audible sound based on the amplified audio signal, such as one or more headphones and/or speakers.

The system 600 may be included in any suitable device, such as a mobile phone, a computer, an outboard USB DAC device, an audio/video receiver, an integrated amplifier, a standalone audio amplifier, a powered speaker (e.g., a smart speaker or a non-smart powered speaker), etc.

In some embodiments, the system 600 may include an audio processor circuit to process the digital audio signal prior to passing it to the DAC 602. For example, the audio processor may include a digital signal processor to implement audio processing such as filtering and delays. Additionally, or alternatively, the system 600 may include one or more additional components, such as one or more processors, memory (e.g., random access memory (RAM), mass storage (e.g., flash memory, hard-disk drive (HDD), etc.), antennas, a display, etc.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

What is claimed is:

1. An audio amplifier circuit comprising:
an input terminal to receive an input audio signal;
a gain stage that includes one or more amplifiers;
an output stage coupled to an output of the gain stage;
a first impedance network coupled between an output of the output stage and an output terminal of the audio amplifier circuit;
a second impedance network coupled between the output of the gain stage and the input of the gain stage;
a third impedance network coupled between the output of the gain stage and the output terminal of the audio amplifier circuit;
a fourth impedance network coupled between the output of the output stage and the input of the gain stage, wherein the first, second, third, and fourth impedance networks are balanced in a bridge arrangement;
a fifth impedance network that includes a first resistor coupled between the input terminal and an intermediate node of the fifth impedance network, and a second resistor coupled between the output terminal and the intermediate node to provide a feedback path between an output terminal of the audio amplifier circuit and an input of the gain stage; and
an input impedance network coupled between the intermediate node and the input of the gain stage, wherein the input impedance network is to implement a low-pass filter for the audio amplifier circuit.

2. The audio amplifier circuit of claim 1, wherein the fifth impedance network further includes a capacitor coupled to the intermediate node.

3. The audio amplifier circuit of claim 1, wherein the input impedance network includes:
a third resistor and a fourth resistor coupled in series between the intermediate node and the input of the gain stage; and
a second capacitor coupled to a node between the third and fourth resistors.

4. The audio amplifier circuit of claim 1, wherein the low pass filter is a second order filter or a third order filter.

5. The audio amplifier circuit of claim 1, wherein the input impedance network forms an integrator with the gain stage, the second impedance network, and the fourth impedance network.

6. The audio amplifier circuit of claim 1, wherein the first, second, third, fourth, and fifth impedance networks and the input impedance network include only resistors and capacitors.

7. The audio amplifier circuit of claim 1, wherein:
the first impedance network includes a fifth resistor;
the second impedance network includes a third capacitor;
the third impedance network includes a sixth resistor in parallel with a fourth capacitor; and
the fourth impedance network includes a seventh resistor in series with a fifth capacitor.

8. The audio amplifier circuit of claim 7, wherein:
the third impedance network further includes an eighth resistor in series with the fourth capacitor, wherein the eighth resistor and the fourth capacitor are in parallel with the sixth resistor; and
the fourth impedance network further includes a ninth resistor and a sixth capacitor in series with one another and in parallel with the seventh resistor.

9. The audio amplifier circuit of claim 1, wherein the input terminal is a first input terminal, wherein the audio amplifier circuit further includes a second input terminal to provide a differential input for the audio amplifier circuit, wherein the input of the gain stage is a first input of the gain stage, and wherein the audio amplifier circuit further includes:
a sixth impedance network coupled between a second input of the gain stage and a ground terminal, wherein the sixth impedance network is to provide an impedance that corresponds to an impedance of the second impedance network in parallel with the fourth impedance network.

10. The audio amplifier circuit of claim 1, wherein the gain stage includes an operational amplifier, and wherein the input is an inverting input of the operational amplifier.

11. The audio amplifier circuit of claim 1, wherein the input terminal is coupled to receive the input audio signal from a digital-to-analog converter (DAC) circuit.

12. An audio amplifier circuit with an integrated low-pass filter, the audio amplifier circuit comprising:
an input terminal to receive an input audio signal;
an output terminal to provide an amplified output audio signal;
a gain stage that includes an operational amplifier;
an output stage coupled between an output of the gain stage and the output terminal;
a first impedance network that includes a first resistor coupled between an output of the output stage and the output terminal of the audio amplifier circuit;
a second impedance network that includes a first capacitor coupled between the output of the gain stage and the input of the gain stage;

a third impedance network coupled between the output of the gain stage and the output terminal of the audio amplifier circuit, wherein the third impedance network includes a second resistor in parallel with a second capacitor;

a fourth impedance network coupled between the output of the output stage and the input of the gain stage, wherein the fourth impedance network includes a third resistor in series with a third capacitor;

a fifth impedance network that includes:
  a fourth resistor coupled between the input terminal and an intermediate node of the fifth impedance network;
  a fifth resistor coupled between the output terminal and the intermediate node; and
  a fourth capacitor with a capacitor terminal coupled to the intermediate node; and an input impedance network that includes:
  a sixth resistor and a seventh resistor coupled between the intermediate node and an inverting input of the operational amplifier; and
  a fifth capacitor coupled to a node between the sixth and seventh resistors.

13. The audio amplifier circuit of claim 12, wherein the input impedance network forms an integrator with the gain stage, the second impedance network, and the fourth impedance network.

14. The audio amplifier circuit of claim 12, wherein the first, second, third, and fourth impedance networks are balanced in a bridge relationship.

15. The audio amplifier circuit of claim 12, wherein the first, second, third, fourth, and fifth impedance networks and the input impedance network include only resistors and capacitors.

16. The audio amplifier circuit of claim 12, wherein:
  the third impedance network further includes an eighth resistor in series with the second capacitor, wherein the eighth resistor and the second capacitor are in parallel with the second resistor; and
  the fourth impedance network further includes a ninth resistor and a sixth capacitor in series with one another and in parallel with the third resistor.

17. The audio amplifier circuit of claim 12, wherein the input terminal is a first input terminal, wherein the audio amplifier circuit further includes a second input terminal to provide a differential input for the audio amplifier circuit, and wherein the audio amplifier circuit further includes:
  a sixth impedance network coupled between a non-inverting input of the operational amplifier and a ground terminal, wherein the sixth impedance network is to provide an impedance that corresponds to an impedance of the second impedance network in parallel with the fourth impedance network.

18. An audio output system comprising:
  a digital-to-analog converter (DAC) circuit;
  an audio amplifier circuit to receive an output of the DAC circuit as an input signal, wherein the audio amplifier circuit includes:
    an input terminal to receive the input signal;
    a gain stage that includes one or more amplifiers;
    an output stage that is coupled between the gain stage and an output terminal of the audio amplifier circuit;
    a first impedance network coupled between an output of the output stage and the output terminal of the audio amplifier circuit;
    a second impedance network coupled between the output of the gain stage and the input of the gain stage;
    a third impedance network coupled between the output of the gain stage and the output terminal of the audio amplifier circuit;
    a fourth impedance network coupled between the output of the output stage and the input of the gain stage, wherein the first, second, third, fourth, and fifth impedance networks are balanced in a bridge arrangement;
    a fifth impedance network that is to provide a feedback path between an output terminal of the audio amplifier circuit and an input of the gain stage; and
    an input impedance network coupled between a node of the first impedance network and the input of the gain stage, wherein the input impedance is to implement a low-pass filter;
    wherein the first, second, third, fourth, and fifth impedance networks and the input impedance network include only resistors and capacitors.

19. The audio output system of claim 18, wherein the input impedance network forms an integrator with the gain stage, the second impedance network, and the fourth impedance network.

20. The audio output system of claim 18, wherein the node of the fifth impedance network is an intermediate node, and wherein:
  the fifth impedance network includes:
    a first resistor coupled between the input terminal of the audio amplifier circuit and the intermediate node of the first impedance network;
    a second resistor coupled between the output terminal and the intermediate node; and
    a first capacitor with a capacitor terminal coupled to the intermediate node; and
  the input impedance network includes:
    a third resistor and a fourth resistor coupled between the intermediate node and the input of the gain stage; and
    a second capacitor coupled to a node between the third and fourth resistors.

21. The audio output system of claim 20, wherein:
  the first impedance network includes a fifth resistor;
  the second impedance network includes a third capacitor;
  the third impedance network includes a sixth resistor in parallel with a fourth capacitor; and
  the fourth impedance network includes a seventh resistor in series with a fifth capacitor.

22. The audio output system of claim 21, wherein:
  the third impedance network further includes an eighth resistor in series with the fourth capacitor, wherein the eighth resistor and the fourth capacitor are in parallel with the sixth resistor; and
  the fourth impedance network further includes a ninth resistor and a sixth capacitor in series with one another and in parallel with the seventh resistor.

23. The audio output system of claim 18, wherein the input terminal is a first input terminal, and wherein the audio amplifier circuit has a differential input that includes the first input terminal and a second input terminal.

24. The audio output system of claim 18, further comprising one or more speakers coupled to the output terminal of the audio amplifier circuit.

* * * * *